US010705131B2

(12) United States Patent
Vinogradova et al.

(10) Patent No.: US 10,705,131 B2
(45) Date of Patent: Jul. 7, 2020

(54) METHOD AND APPARATUS FOR LOCATING FAULTS IN OVERHEAD POWER TRANSMISSION LINES

(71) Applicant: Obschestvo S Ogranichennoj Otvetstvennostyu "Laboratoriya Buduschego", Ekaterinburg (RU)

(72) Inventors: Lubov Olegovna Vinogradova, Ekaterinburg (RU); Vadim Aleksandrovich Krivorotov, Zarechny (RU); Alexander Viktorovich Lemekh, Ekaterinburg (RU); Viacheslav Andreyevich Tretyakov, Goeppingen (DE); Arnold Georgiyevich Shastin, Zarechny (RU)

(73) Assignee: Obschestvo S Ogranichennoj Otvetstvennostyu "Laboratoriya Buduschego", Ekaterinburg (RU)

( * ) Notice: Subject to any disclaimer, the term of this patent is extended or adjusted under 35 U.S.C. 154(b) by 25 days.

(21) Appl. No.: 15/116,349

(22) PCT Filed: Mar. 12, 2014

(86) PCT No.: PCT/RU2014/000160
§ 371 (c)(1),
(2) Date: Feb. 27, 2017

(87) PCT Pub. No.: WO2015/115927
PCT Pub. Date: Aug. 6, 2015

(65) Prior Publication Data
US 2017/0168107 A1    Jun. 15, 2017

(30) Foreign Application Priority Data
Feb. 3, 2014 (RU) .................................. 2014103626

(51) Int. Cl.
*G01R 31/08* (2020.01)
*H02G 1/02* (2006.01)
*B64D 47/00* (2006.01)

(52) U.S. Cl.
CPC ........... *G01R 31/085* (2013.01); *B64D 47/00* (2013.01); *H02G 1/02* (2013.01); *G01R 31/08* (2013.01)

(58) Field of Classification Search
CPC ......... G01R 31/085; H02G 1/02; B64D 47/00
See application file for complete search history.

(56) References Cited

U.S. PATENT DOCUMENTS

| | | |
|---|---|---|
| 4,818,990 A | 4/1989 | Fernandes |
| 4,904,996 A | 2/1990 | Fernandes |

(Continued)

FOREIGN PATENT DOCUMENTS

| | | |
|---|---|---|
| CN | 1 645 284 A | 7/2005 |
| CN | 201489078 | 5/2010 |

(Continued)

OTHER PUBLICATIONS

Extended EP Search Report dated Jan. 16, 2017 in corresponding EP App. No. 14881049.2.

*Primary Examiner* — Akm Zakaria
(74) *Attorney, Agent, or Firm* — Boyle Fredrickson S.C.

(57) ABSTRACT

The preferred embodiments relate to power engineering and can be used for locating faults in overhead power transmission lines. A method for locating faults in overhead power transmission lines includes installing, on a lightning-protector cable or power conductor, an apparatus for locating faults in overhead power transmission lines, controlling the movement of the apparatus, controlling the operation of apparatuses for inspecting the overhead power transmission lines, and receiving, processing and analyzing data produced by those apparatuses. Furthermore, the placement and control (Continued)

of the movement of the fault-locating apparatus are carried out with the aid of a helicopter-type aircraft. The apparatus for locating faults in overhead power transmission lines comprises a control system, apparatuses for inspecting the overhead power transmission lines, and a drive system, wherein the apparatus additionally comprises a helicopter-type aircraft.

4 Claims, 3 Drawing Sheets

(56) References Cited

U.S. PATENT DOCUMENTS

| | | | |
|---|---|---|---|
| 6,494,141 B2 | 12/2002 | Montambault et al. | |
| 7,496,459 B2 | 2/2009 | McAllister et al. | |
| 2006/0114122 A1* | 6/2006 | Jones | H02G 1/02 340/870.07 |
| 2011/0196535 A1 | 8/2011 | Phillips et al. | |
| 2013/0257449 A1* | 10/2013 | Hyde | H02G 1/02 324/543 |
| 2014/0266237 A1* | 9/2014 | Lindsey | G01R 15/142 324/512 |
| 2015/0330367 A1* | 11/2015 | Homsy | F03D 11/0008 416/244 A |

FOREIGN PATENT DOCUMENTS

| | | |
|---|---|---|
| CN | 101 807 080 A | 8/2010 |
| CN | 202 071 987 U | 12/2011 |
| CN | 102317040 | 1/2012 |
| CN | 102 340 113 A | 2/2012 |
| CN | 102 780 177 A | 11/2012 |
| CN | 102 941 920 A | 2/2013 |
| CN | 103 235 602 A | 8/2013 |
| CN | 103434661 A | 12/2013 |
| JP | 2012257372 | 12/2012 |
| RU | 2421746 | 6/2011 |
| RU | 2483314 | 5/2013 |

* cited by examiner

METHOD AND APPARATUS FOR LOCATING FAULTS IN OVERHEAD POWER TRANSMISSION LINES

BACKGROUND OF THE INVENTION

Field of the Invention

The claimed group of inventions relates to power engineering and can be used for locating faults in overhead power transmission lines.

Description of Related Art

The prior art knows a method of locating faults in high-voltage power transmission lines, which consists of recording high-frequency electrical pulses near the power transmission line with the aid of an electromagnetic sensor and a digital oscillograph connected to it by parallel overflight of the line. The measuring apparatus is moved along the power transmission line with the aid of an automatically controllable compact pilotless aircraft or drone [RU2421746, IPC G01R31/08, Feb. 10, 2010].

The prior art knows a method of aerially locating faults in power transmission lines, which consists of recording high-frequency electrical pulses near the power transmission lines with the aid of an electromagnetic sensor and a digital oscillograph connected to it during parallel overflight of the line. The measuring device is moved along the power transmission line route with the aid of an automatically controllable compact pilotless aircraft or drone. During the flight, the magnetic field intensity is measured with sensors located on the aircraft's wingtips, and the average magnetic field intensity is calculated as $H_{avg}=(H_r+H_l)/2$ and used for automatic maintenance of the aircraft's vertical position relative to the power transmission line conductors [RU2483314, IPC G01R31/08, Nov. 18, 2011].

As a prototype, a method of locating faults in power transmission lines was chosen, which is effected with the aid of a robot for locating faults in power transmission lines, which includes installing the robot for locating faults in power transmission lines with the capability of movement near and along the power transmission lines along the lightning-protector cable or power conductor; controlling the movement of the apparatus for locating faults in power transmission lines along overhead power transmission lines and across their pylons with the aid of a drive system; controlling the operation of the apparatuses for inspecting overhead power transmission lines; and acquiring, processing, and analyzing data collected thereby [CN102317040, IPC B25J13/08; B60K16/00, Feb. 10, 2011].

The prior art knows an apparatus for finding faults in power transmission lines, which contains a device for radio transmission of a wireless signal to a ground station, a microcontroller, and a video camera whose images from the camera can be transmitted and acquired with the aid of the radio transmitter, one ground station for receiving the wireless signal from the radio transmitter, and a microcomputer [CN201489078, IPC G01N21/88; G01R31/08, Jun. 15, 2009].

The prior art knows a robot for locating faults in overhead power transmission lines, which includes a communication and control system, a drive system, a camera, a set of sensors for recording the condition of the power transmission lines, and a navigation device [CN102317040, IPC B25J13/08; B60K16/00, Feb. 10, 2011].

As a prototype, a self-propelled fault-locating apparatus was chosen, which contains a control system, a set of sensors for recording the condition of the power transmission lines, and a drive system and capture device made to permit the self-propelled fault-locating apparatus to move along the overhead power transmission lines and across their pylons [JP2012257372, IPC H02G1/02, Jun. 8, 2011].

The shortcoming of the prior-art apparatuses and the method chosen as a prototype is the impossibility of locating faults in the absence of special equipment such as a crane needed to place the apparatus for locating faults in overhead power transmission lines on the lightning-protector cable or to overcome anchor pylons, where the direction of the lightning-protector cable varies by some angle.

The technical problem addressed by the claimed method and apparatus is that of expanding the range of resources.

The technical result is that the range of methods and apparatuses for locating faults in overhead power transmission lines is expanded, and the capability of locating faults in overhead power transmission lines is provided without additional special equipment.

The prior art knows a self-propelled, autonomous mechanical apparatus made with the capability of connecting to the supply network of the conductor and moving along it, and capable of recognizing basic states of the conductor and reporting them, where the apparatus contains a drive system, case, central processor, memory devices, sensor electronics, communication interface, and mating element [U.S. Pat. No. 7,496,459, IPC G01R31/08, Apr. 3, 2007].

The most similar in technical essence to the component of the apparatus for locating faults in overhead power transmission lines is a vehicle for use on a power transmission lines, which includes three wheels, two movable pressure (clamping) wheels and a motor, which consist of a drive system, battery, and control system connected to the motor [U.S. Pat. No. 6,494,141, IPC H02G1/02; H02G7/16; B61B7/06; E01B25/16, Feb. 22, 2000].

The shortcoming of the prior-art apparatuses is the difficulty of initially installing the apparatuses for locating faults in overhead power transmission lines on the lightning-protector cable or power conductor due to the absence of components that would set the trajectory of the lightning-protector cable or power conductor, respectively, within the fault-locating apparatus.

The technical problem addressed by a component of the claimed apparatus is that of expanding the range of apparatuses and simplifying the process of installing the apparatus for locating faults in overhead power transmission lines on the lightning-protector cable or power conductor.

The technical result is that the range of apparatuses for locating faults in overhead power transmission lines is expanded, and the process of installing the apparatus for locating faults in overhead power transmission lines on the lightning-protector cable or power conductor is simplified by the use of guides attached to its case and made with the capability of setting the trajectory of the lightning-protector cable or power conductor within the apparatus for locating faults in overhead power transmission lines to a position permitting its installation on the lightning-protector cable or power conductor.

SUMMARY OF THE INVENTION

The essence of the claimed method of locating faults in overhead power transmission lines, apparatus for its realization, and component thereof consists of the following.

The method of locating faults in overhead power transmission lines includes installing the apparatus for locating faults in overhead power transmission lines on the lightning-protector cable or power conductor with the capability of movement near and along the overhead power transmission lines; controlling the movement of the apparatus for locating faults in overhead power transmission lines along the overhead power transmission lines and across their pylons with the aid of a drive system; controlling the operation of the apparatuses for inspecting overhead power transmission lines; and acquiring, processing, and analyzing the data collected thereby. The placement of the apparatus for inspecting overhead power transmission lines and controlling its movement across the pylons of the overhead power transmission lines is effected with the aid of helicopter-type aircraft, while the movement of the apparatus for inspecting overhead power transmission lines across the pylons of the overhead power transmission lines involves removal of the apparatus for inspecting overhead power transmission lines from the lightning-protector cable or power conductor, overflight of the apparatus for inspecting overhead power transmission lines, and reinstallation on the lightning-protector cable or power conductor.

The apparatus for locating faults in overhead power transmission lines contains a control system, an apparatus for inspecting overhead power transmission lines connected to a battery, a drive system located in the case and connected to the motor, which drive system is made with the capability of locking the position of the fault-locating apparatus relative to the lightning-protector cable or power conductor and moving it along and near the overhead power transmission lines. The apparatus for locating faults in overhead power transmission lines additionally contains a helicopter-type aircraft connected to a battery, which includes a control system and is attached to the outside of the case; and the case is additionally outfitted with guides made with the capability of setting the trajectory of the lightning-protector cable or power conductor within the apparatus for locating faults in overhead power transmission lines to a position permitting locking of the position of the apparatus for locating faults in overhead power transmission lines on the lightning-protector cable or power conductor.

A component of the apparatus for locating faults in overhead power transmission lines contains a control system and an apparatus for inspecting overhead power transmission lines, both connected to a battery located in the case and connected to the motor of the drive system, made with the capability of locking the position of the apparatus for locating faults in overhead power transmission lines relative to the lightning-protector cable or power conductor and moving it along and near overhead power transmission lines. The case is additionally outfitted with guides made with the capability of setting the trajectory of the lightning-protector cable or power conductor within the apparatus for locating faults in overhead power transmission lines to a position permitting locking of the apparatus for locating faults in overhead power transmission lines on the lightning-protector cable or power conductor.

The control system is designed to control the movement of the apparatus for locating faults in overhead power transmission lines. The control system may be operated by means of radio control with the aid of an operator control panel. The control system includes a signal receiver, a controller, and a motor driver.

The drive system may be realized with the aid of a stepping movement, a set of rollers, and other similar means. The drive system is made with the capability of connection to and disconnection from the lightning-protector cable or power conductor, and drive system elements are made with the capability of movement relative to one another, which affords the possibility of installation, removal, and movement of the apparatus for locating faults in overhead power transmission lines along the lightning-protector cable or power conductor. The drive system can consist of two traveling rollers and a clamping roller made with the capability of movement relative to the lightning-protector cable in the vertical plane with the aid of an additional electric drive and clamping of the lightning-protector cable to the traveling rollers. The guides are made with the capability of setting the trajectory of the lightning-protector cable or power conductor within the apparatus for locating faults in overhead power transmission lines to a position permitting the apparatus for locating faults in overhead power transmission lines to be installed on the lightning-protector cable or power conductor.

The helicopter-type aircraft consists of at least a two-rotor helicopter with an electronic stabilizer, a control system, and an electronic device for determining coordinates. The helicopter-type aircraft can be made in the form of a pilotless aircraft or remotely piloted vehicle. The helicopter-type aircraft is attached to outside of the case of the apparatus for locating faults in overhead power transmission lines.

The battery can be attached to the outside of the case of the apparatus for locating faults in overhead power transmission lines.

The apparatuses for inspecting overhead power transmission lines are designed to find faults in the condition and spatial position of the following elements: lightning-protector cable, power conductor, pylon structural elements, suspension clamp and anchor of the lightning-protector cable, insulator fasteners, insulator strings, vibration dampers, and other equipment. The following may be used as apparatuses for locating faults in overhead power transmission lines: a high-resolution video camera with the capability of varying focus over wide ranges, a television for finding faults in the condition of power conductors, a laser scanner for mapping the route and crossings, an ultrasound scanner for the lightning-protector cable, an ultraviolet scanner for diagnosing discharges and coronas, and other devices with the same uses. The apparatuses for inspecting overhead power transmission lines are attached on the outside of the apparatus for locating faults in overhead power transmission lines and may be attached to the case of the apparatus or its external components, for example, on a helicopter-type aircraft.

The claimed method and apparatus for locating faults in overhead power transmission lines may be realized with the aid of an apparatus that is elucidated by the following drawings. The claimed component is part of the apparatus for locating faults in overhead power transmission lines.

These and other features and advantages of the invention will become apparent to those skilled in the art from the following description and the accompanying drawing. It should be understood, however, that the detailed description and specific examples, while indicating a preferred embodiment of the present invention, are given by way of illustration and not of limitation. Many changes and modifications may be made within the scope of the present invention without departing from the spirit thereof, and the invention includes all such modifications.

DETAILED DESCRIPTION OF THE PREFERRED EMBODIMENTS

Figure 1:
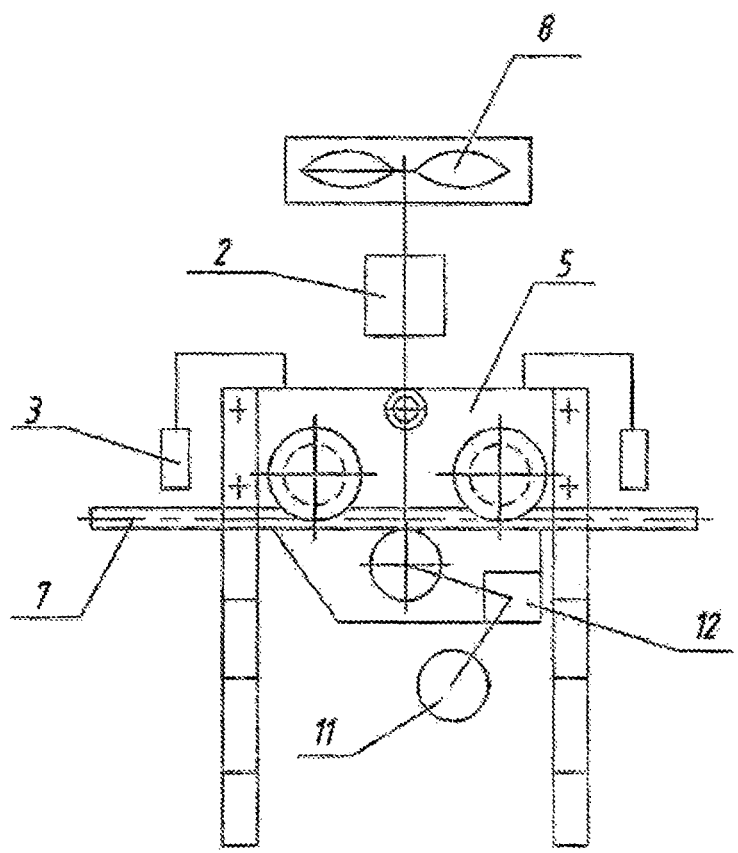
FIG. 1: Projection of the apparatus for locating faults in overhead power transmission lines (front view).
Figure 2:
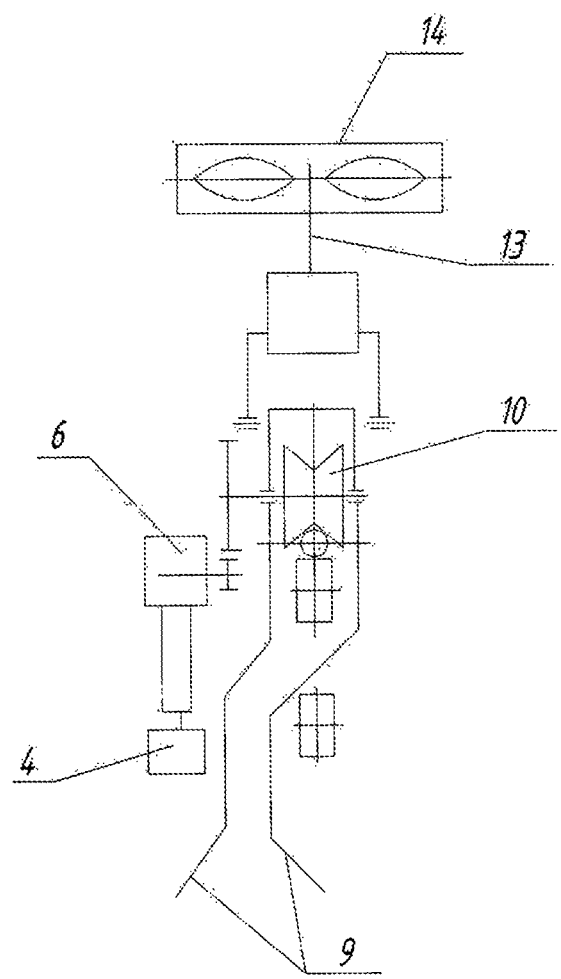
FIG. 2: Projection of the apparatus for locating faults in overhead power transmission lines (view from the left).

The apparatus for locating faults in overhead power transmission lines 1 contains a control system (not designated in the figures), apparatuses for inspecting overhead power transmission lines 2 and 3, connected to battery 4, a drive system (not designated in the figures) located in case 5 and connected to motor 6, made with the capability of locking the position of fault-locating apparatus 1 relative to lightning-protector cable 7 and moving it along and near power transmission lines (not designated in the figure). The apparatus for locating faults in overhead power transmission lines 1 additionally contains helicopter-type aircraft 8, connected to battery 4, including a control system (not shown in the figure) and attached to the outside of case 5, where case 5 is additionally outfitted with guides 9, made with the capability of setting the trajectory of lightning-protector cable 7 within the apparatus for locating faults in overhead power transmission lines 1 to a position permitting locking of the apparatus for locating faults in overhead power transmission lines 1 relative to lightning-protector cable 7.

The component (not designated in the figures) of the apparatus for locating faults in overhead power transmission lines contains a control system (not designated in the figures), apparatuses for inspecting overhead power transmission lines 2 and 3, connected to battery 4, a drive system (not designated in the figure) located in case 5 and connected to motor 6, made with the capability of locking the position of fault-finding apparatus 1 relative to lightning-protector cable 7 and moving it along and near the overhead power transmission lines (not designated in the figure). Case 5 is additionally outfitted with guides 9, made with the capability of setting the trajectory of lightning-protector cable 7 within the apparatus for locating faults in overhead power transmission lines 1 to a position permitting locking of the apparatus for locating faults in overhead power transmission lines 1 relative to lightning-protector cable 7.

The control system (not designated in the figures) is realized by means of radio control with the aid of an operator control panel and contains a signal receiver (not designated in the figures), a direct-current motor driver (not designated in the figures), and a controller (not designated in the figures).

The drive system (not designated in the figures) consists of two traveling rollers 10 and a clamping roller 11 made with the capability of movement relative to the lightning-protector cable 7 in the vertical plane with the aid of an additional electric drive 12 and clamping of the lightning-protector cable 7 to the traveling rollers 10.

Guides 9 have a fork-type attachment and consist of curved guides. Guides 9 are attached to the outside of case 5.

Case 5 contains metal rod 13, behind which helicopter-type aircraft 8 is attached to it. Helicopter-type aircraft 8 consists of an eight-rotor helicopter with protective enclosure 14, electronic stabilizer (not designated in the figures), a control system (not designated in the figures) and an electronic device for determining coordinates (not designated in the figures).

Battery 4 is attached to the outside of case 5.

The following are used as apparatuses for inspecting overhead power transmission lines 2 and 3: high-resolution video camera 2 with the capability of varying focus over wide ranges, and additional inspection devices 3: a television for finding faults in the condition of power conductors, a laser scanner for mapping the route and crossings, an ultrasound scanner for the lightning-protector cable, and an ultraviolet scanner for diagnosing discharges and coronas. Each of the apparatuses for inspecting overhead power transmission lines 2 and 3 are attached to the outside of case 5 of the apparatus for locating faults in overhead power transmission lines 1.

The method of finding faults in overhead power transmission lines includes installing the apparatus for locating faults in overhead power transmission lines 1 on lightning-protector cable 7 with the capability of movement near and along the overhead power transmission lines (not designated in the figures); controlling the movement of the apparatus for locating faults in overhead power transmission lines 1 along the overhead power transmission lines (not designated in the figures) and across their pylons 15 with the aid of a drive system (not designated in the figures); controlling the operation of the apparatuses for inspecting overhead power transmission lines 2 and 3; and acquiring, processing, and analyzing data collected thereby. The placement of the apparatus for inspecting overhead power transmission lines 1 and controlling its movement across pylons 15 of the overhead power transmission lines is effected with the aid of helicopter-type aircraft 8, while control of the movement of the apparatus for inspecting overhead power transmission lines 1 across the overhead power transmission line pylons 15 involves removal of apparatus 1 from the lightning-protector cable 7, overflight of apparatus 1, and reinstallation on lightning-protector cable 7.

The operating principle of the claimed inventions is realized as follows.

First, the apparatus for finding faults in overhead power transmission lines 1 is installed with the aid of pilotless helicopter-type aircraft 8 from position A (FIG. 3) to position B (FIG. 3): helicopter-type aircraft 8 is powered from battery 4 and with the aid of lift and propulsive forces lifts the component of the apparatus for finding faults in overhead power transmission lines (not designated in the figures) to lightning-protector cable 7, after which the component is installed on lightning-protector cable 7. Lightning-protector cable 7, falling between guides 9 and with their aid bypassing clamping roller 11, falls between clamping roller 11 and traveling rollers 10. Then clamping roller 11 is lifted by means of additional drive 12 and locks lightning-protector cable 7, ensuring its correct positioning. The movement of pilotless helicopter-type aircraft 8 is controlled with the aid of a control system (not designated in the figures), which receives operator commands sent with the aid of a control panel (not designated in the figures).

Figure 3:
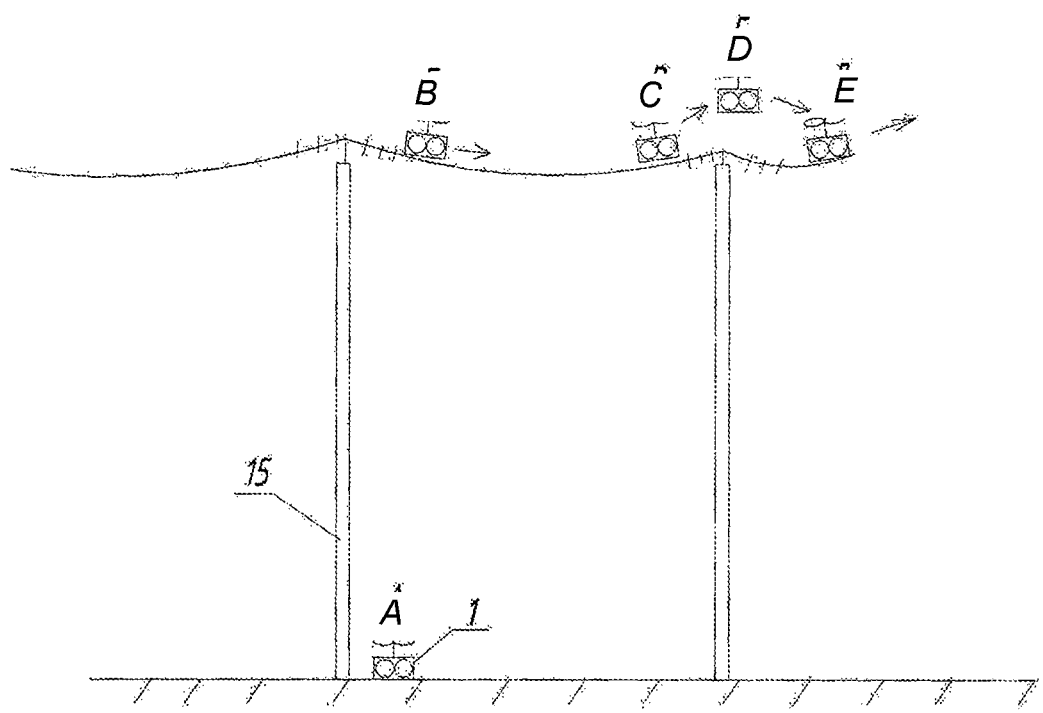
FIG. 3: Set of positions of the apparatus for locating faults in overhead power transmission lines relative to the lightning-protector cable.

Then with the aid of the control system (not designated in the figures), the operator controls the operation of the apparatuses for inspecting overhead power transmission lines 2 and 3, obtains the results of their operation with the aid of the control panel (not designated in the figures), processes and analyzes the incoming data, and controls the movement of the apparatus for finding faults in overhead power transmission lines 1 along lightning-protector cable 7. Motor 6, powered by battery 4, rotates traveling rollers 10, which moves the apparatus for finding faults in overhead power transmission lines 1. When the apparatus approaches overhead power transmission line pylon 15, position C (FIG. 3), the operator issues the removal command. Battery 4 delivers power to helicopter-type aircraft 8, which switches on. Clamping roller 11 is lowered by additional electric drive 12, releasing lightning-protector cable 7. Then, controlling the operation of helicopter-type aircraft 8, the operator releases lightning-protector cable 7 from guides 9 and moves the component of the apparatus across pylon 15, positions D and E (FIG. 3). Then the apparatus for finding faults in overhead power transmission lines 1 is reinstalled. This set of operations is repeated throughout the operation of apparatus 1, then fault-finding apparatus 1 is removed from lightning-protector cable 7 and with the aid of pilotless helicopter-type aircraft 8 is lowered to a landing pad (not designated in the figures) or any other level surface of suitable size.

Although the best mode contemplated by the inventors of carrying out the present invention is disclosed above, practice of the above invention is not limited thereto. It will be manifest that various additions, modifications and rearrangements of the features of the present invention may be made without deviating from the spirit and the scope of the underlying inventive concept.

The invention claimed is:

1. A fault-finding apparatus for finding faults in overhead power transmission lines using a helicopter-type aircraft, the fault-finding apparatus comprising:
    a battery;
    a control system;
    an inspection apparatus for inspecting overhead power transmission lines; and
    a drive system located in a case and connected to a motor, wherein the drive system locks the position of the fault-finding apparatus relative to a lightning-protector cable or a power conductor and moves it along or near the overhead power transmission lines, where the locked position is not locked relative to the overhead power transmission lines,
    wherein the control system, the inspection apparatus and the helicopter-type aircraft are connected to the battery,
    wherein the helicopter-type aircraft includes a helicopter control system and is attached to the outside of the case; and
    wherein the case is additionally outfitted with guides to set the trajectory of the lightning-protector cable or power conductor inside the fault-finding apparatus to a position permitting locking of the fault-finding apparatus on the lightning-protector cable or power conductor,
    further wherein the drive system consists of two traveling rollers and a clamping roller, the clamping roller made with the capability of movement relative to the lightning-protector cable or power conductor in the vertical plane and clamping the lightning-protector cable or power conductor to the traveling rollers.

2. The fault-finding apparatus for finding faults in overhead power transmission lines of claim 1, wherein the helicopter-type aircraft consists at least of a two-rotor helicopter with protective enclosure, electronic stabilizer, control system, and electronic device for determining coordinates.

3. A component of a fault-finding apparatus for finding faults in overhead power transmission lines, the component comprising:
    a control system;
    an inspection apparatus for inspecting overhead power transmission lines;
    a drive system located in a case and connected to a motor, the drive system locking the position of the fault-finding apparatus relative to a lightning-protector cable or a power conductor and moving it along or near the overhead power transmission lines, where the locked position is not locked relative to the overhead power transmission lines; and
    wherein the case is outfitted with guides made with the capability of setting the trajectory of the lightning-protector cable or power conductor inside the fault-finding apparatus to a position permitting locking of the fault-finding apparatus on the lightning-protector cable or power conductor,
    further wherein the drive system consists of two traveling rollers and a clamping roller, the clamping roller made with the capability of movement relative to the lightning-protector cable or power conductor in the vertical plane and pressing the lightning-protector cable or power conductor against the traveling rollers.

4. The component of a fault-finding apparatus of claim 3, further including a helicopter-type aircraft attached to the case, wherein the helicopter-type aircraft includes at least a two-rotor helicopter with protective enclosure, an electronic stabilizer, a control system, and an electronic device for determining coordinates.

* * * * *